United States Patent
Hwang et al.

(10) Patent No.: US 7,649,797 B2
(45) Date of Patent: Jan. 19, 2010

(54) SELF-REFRESH CONTROL CIRCUIT AND SEMICONDUCTOR MEMORY DEVICE INCLUDING THE SAME

(75) Inventors: Soo-Man Hwang, Hwaseong-si (KR); Ho-Cheol Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 66 days.

(21) Appl. No.: 12/031,110

(22) Filed: Feb. 14, 2008

(65) Prior Publication Data
US 2008/0205183 A1    Aug. 28, 2008

(30) Foreign Application Priority Data
Feb. 28, 2007    (KR) .................... 10-2007-0019964

(51) Int. Cl.
G11C 7/22    (2006.01)
(52) U.S. Cl. ...................................... 365/222; 327/536
(58) Field of Classification Search ................. 365/222; 327/536
See application file for complete search history.

(56) References Cited

U.S. PATENT DOCUMENTS

| | | | |
|---|---|---|---|
| 5,594,704 A * | 1/1997 | Konishi et al. ......... | 365/233.15 |
| 6,134,167 A * | 10/2000 | Atkinson ..................... | 365/222 |
| 6,426,908 B1 * | 7/2002 | Hidaka ........................ | 365/222 |
| 6,504,787 B2 | 1/2003 | Tsubouchi et al. | |
| 2002/0186609 A1 * | 12/2002 | Tsubouchi et al. ..... | 365/230.03 |
| 2005/0231267 A1 * | 10/2005 | Park ........................... | 327/536 |
| 2005/0275977 A1 * | 12/2005 | Joshi et al. .................... | 361/18 |

FOREIGN PATENT DOCUMENTS

JP        2001283586 A    10/2001
KR    1020030039950 A     5/2003

* cited by examiner

*Primary Examiner*—Hoai V Ho
*Assistant Examiner*—Jay Radke
(74) *Attorney, Agent, or Firm*—Volentine & Whitt, PLLC

(57) ABSTRACT

A refresh control circuit in a semiconductor memory device includes a refresh controller, a voltage generator and a word line enable circuit. The refresh period controller generates a control signal in response to a self-refresh signal, the control signal indicating a nominal initiation of a refresh period. The voltage generator generates an output voltage in response to the control signal. The output voltage is boosted from a low voltage to a high voltage during the refresh period. The word line enable circuit generates a word line enable signal in response to the control signal, wherein the word line enable signal is activated following a delay after the nominal initiation of the refresh period, and the delay allows the voltage generator to fully boost the output voltage.

18 Claims, 5 Drawing Sheets

SELF-REFRESH CONTROL CIRCUIT AND SEMICONDUCTOR MEMORY DEVICE INCLUDING THE SAME

CROSS-REFERENCE TO RELATED APPLICATIONS

This application claims priority under 35 USC §119 to Korean Patent Application No. 10-2007-0019964 filed on Feb. 28, 2007, the subject matter of which is hereby incorporated by reference.

BACKGROUND OF THE INVENTION

1. Field of the Invention

The present invention relates to a self-refresh circuit and operation within a semiconductor memory device. More particularly, the invention relates to a self-refresh control circuit, a semiconductor memory device including a self-refresh control circuit, and a method of controlling a refresh operation in a semiconductor memory device.

2. Description of the Related Art

Random access memory (RAM) is widely used to store data and/or related commands within a system or host device. RAM has several advantages over other forms of memory including an ability to access all addresses in the RAM at substantially the same speed.

RAM may be further classified as static RAM (SRAM) and a dynamic RAM (DRAM). SRAM preserves stored data so long as the SRAM is powered. This data preservation capability within SRAM is enabled by a relatively complicated configuration of four or six transistors arranged in a symmetric latch structure. As a result, SRAM is relatively costly to manufacture and difficult to integrate. In contrast, DRAM may be implemented with a single access transistor and a corresponding storage node such as a capacitor. Accordingly, DRAM is cheaply manufactured and relatively easy to integrate. Unfortunately, DRAM gradually loses stored data because the storage node commonly suffers from current leakage. This DRAM characteristic conventionally mandates the inclusion of a refresh circuit adapted to periodically restore lost charge indicative of stored data to the storage node. The periodicity of the refresh operation is referred as "a refresh rate."

Different operating modes for the system or host device incorporating DRAM will often dictate the refresh rate and other related parameters for the refresh operation. During a standby mode or similar powered-down mode of operation for a system or host device, the data stored in DRAM is often preserved by application of a so-called "self-refresh operation". Thus, by means of an effective self-refresh operation, DRAM may be implemented to mimic the performance advantages of SRAM, albeit generally at lower cost.

Figure 1:
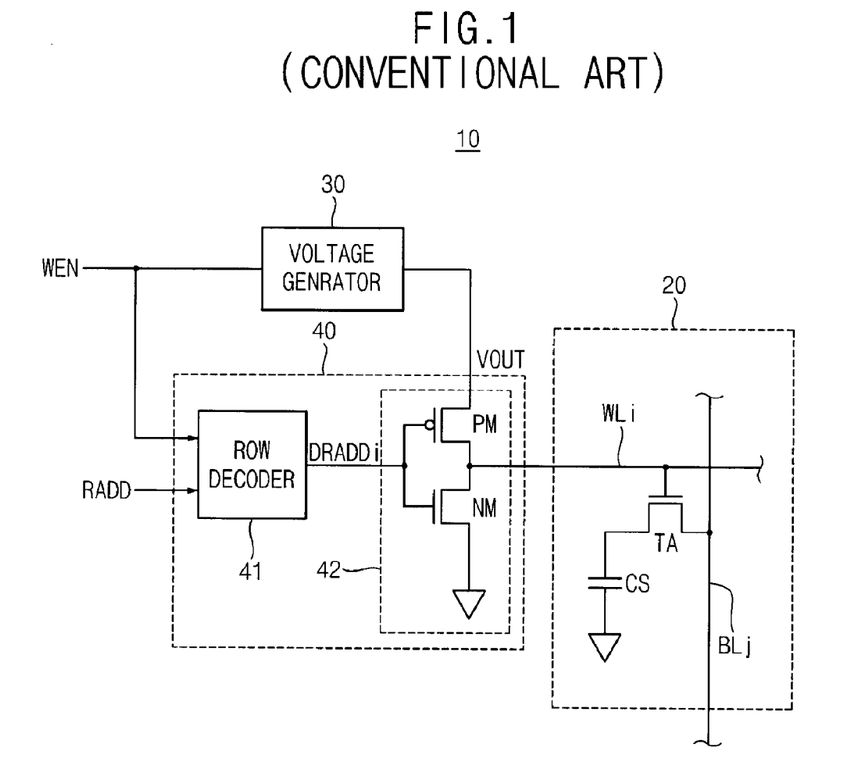
FIG. 1 is a block diagram illustrating a conventional semiconductor memory device.

FIG. 1 is a block diagram illustrating a conventional semiconductor memory device. The exemplary semiconductor memory device illustrated in part by FIG. 1 is further disclosed in U.S. Pat. No. 5,610,863, the subject matter of which is hereby incorporated by reference.

Referring to FIG. 1, a semiconductor memory device 10 includes a memory cell array 20, a voltage generator 30 and a row selection circuit 40. Other conventionally understood components such as the sense amplifier are omitted from FIG. 1 for the sake of clarity.

As is conventional, memory cell array 20 includes a plurality of memory cells coupled to word lines and bit lines. The memory cells are typically divided into designated block units and/or bank units. For convenience of illustration, only a single memory cell is illustrated in memory cell array 20 of FIG. 1. This DRAM memory cell is coupled to a word line WLi and a bit line BLj, and includes a storage capacitor CS and access transistor TA.

Voltage generator 30, which may be referred to as a boosting circuit, generates a high voltage by boosting a power supply voltage using internal pumping capacitors. The generated high voltage is provided to circuitry associated with memory cell array 20.

Row selection circuit 40 includes a row decoder 41 and a word line driving circuit 42. Row decoder 41 decodes a row address signal RADD and provides a decoded row address signal DRADD driving a selected word line (i.e., WLj). Word line driving circuit 42 includes a plurality of drivers respectively coupled to word lines. Only one driver is illustrated in FIG. 1 for convenience of illustration. Each driver circuit 42 including a pair of transistors PM and NM applies a high level voltage to the selected word line and a low level voltage to unselected word lines as dictated by the decoded row address signal DRADDi of the decoded row address signal. The timing of the decoded row address signal DRADDi to the selected word line by driving circuit 42 is controlled by a word line enable signal WEN. For example, the decoded row address signal DRADDi may be applied to the selected word line by driving circuit 42 when word line enable signal WEN is activated (i.e., is logically "high").

In general, a voltage higher than the power supply voltage is applied to the selected word line in order to turn ON the access transistor TA. Voltage generator 30 generates such this high voltage in response to the word line enable signal WEN and provides the high voltage to internal circuits such as word line driving circuit 42.

Figure 2:
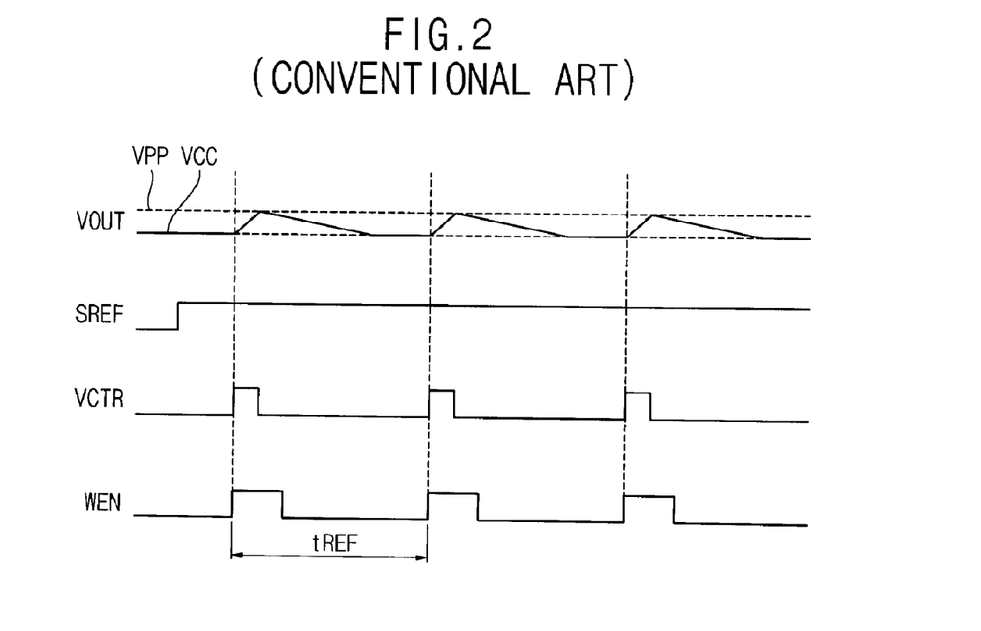
FIG. 2 is a related timing diagram further illustrating a self-refresh operation for the conventional semiconductor memory device of FIG. 1.

FIG. 2 is a related timing diagram illustrating the self-refresh operation of the conventional semiconductor memory device shown in FIG. 1.

Referring to FIGS. 1 and 2, when a self-refresh signal SREF is activated to indicate operation in a self-refresh mode, voltage generator 20 generates a pumping signal VCTR to control the level of an output voltage VOUT in response to the word line enable signal WEN that is also activated during a refresh period tREF. Voltage generator 30 periodically boosts the output voltage VOUT in response to the pumping signal VCTR and the output voltage VOUT is provided to the word line driving circuit 42.

It takes a predetermined period of time to charge the pumping capacitor(s) used to implement voltage generator 30. Accordingly the output voltage may not be sufficiently boosted during an initial stage of the boosting operation, if the boosting operation is performed in synchronization with the word line enable signal WEN. Thus, if the selected word line is enabled while the output voltage VOUT is insufficiently charged, the stored data may be altered by application of an abnormal refresh operation. To prevent the abnormal refresh operation, the word line enable signal WEN should be activated in the refresh mode longer than in a read mode. Nevertheless, the word line may be developed while the output voltage VOUT has an insufficient level, thereby causing the abnormal refresh operation.

Figure 3:
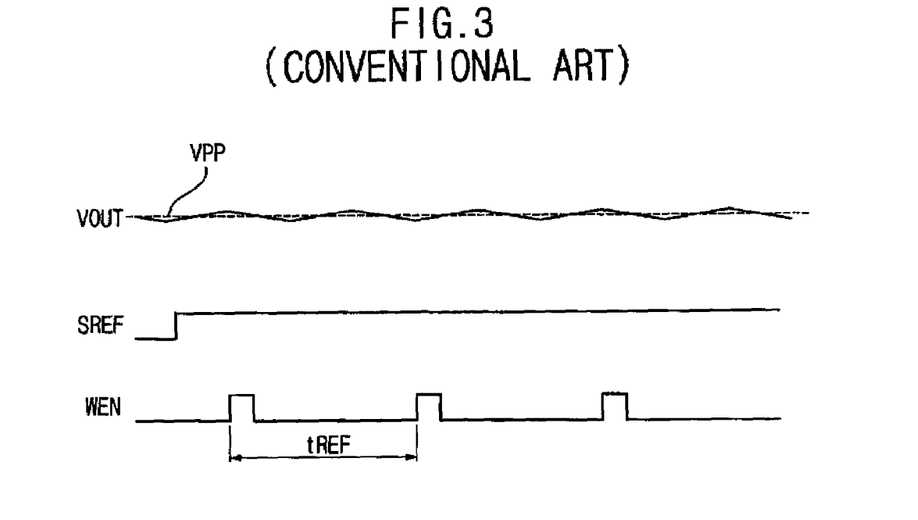
FIG. 3 is another timing diagram illustrating a self-refresh operation for another conventional semiconductor memory device.

FIG. 3 is another timing diagram illustrating a self-refresh operation in another conventional semiconductor memory device.

Referring to FIG. 3, a voltage generator maintains the output voltage VOUT at a high voltage level VPP. In such cases, the timing of the word line enable operation may not be properly correlated with the timing of the pumping operation for the output voltage VOUT. Thus, the refresh period may be reduced. Power consumption, however, is significantly increased due to the consistent pumping operation of the voltage generator.

Accordingly, conventional self-refresh operations experience problems associated with abnormal refresh operation and/or the excessive power consumption.

SUMMARY OF THE INVENTION

In one embodiment, the invention provides a refresh control circuit in a semiconductor memory device, comprising; a refresh period controller configured to generate a control signal in response to a self-refresh signal, wherein the control signal indicates a nominal initiation of a refresh period, a voltage generator configured to generate an output voltage in response to the control signal, wherein the output voltage is boosted from a low voltage to a high voltage during the refresh period, and a word line enable circuit configured to generate a word line enable signal in response to the control signal, wherein the word line enable signal is activated following a delay after the nominal initiation of the refresh period, and the delay allows the voltage generator to fully boost the output voltage.

In another embodiment, the invention provides a semiconductor memory device, comprising; a memory cell array including a plurality of memory cells coupled to word lines and bit lines, respectively, a refresh control circuit configured to generate an output voltage and a word line enable signal in response to a self-refresh signal indicating a nominal initiation of a refresh period, wherein the output voltage is boosted during the refresh period, the word line enable signal is activated following a delay after the nominal initiation of the refresh period, and the delay allows the voltage generator to fully boost the output voltage, and a row selection circuit configured to enable a selected word line in relation to a row address signal, the output voltage, and the word line enable signal.

DESCRIPTION OF EMBODIMENTS

Embodiments of the present invention now will be described with reference to the accompanying drawings. This invention may, however, be embodied in many different forms and should not be construed as limited being limited to only the illustrated embodiments. Rather, these embodiments are provided as teaching examples. Throughout the drawings and written description, like reference numerals refer to like or similar elements.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
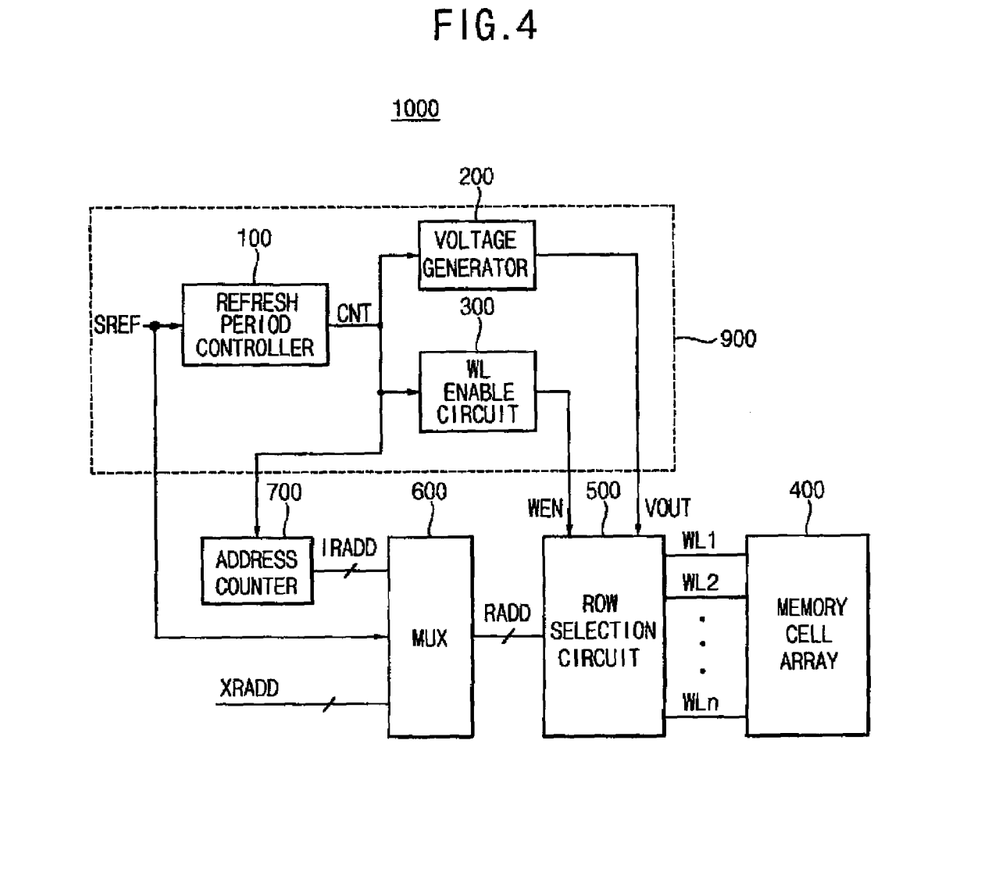
FIG. 4 is a block diagram illustrating a semiconductor memory device according to an embodiment of the invention.

FIG. 4 is a block diagram illustrating a semiconductor memory device according to an embodiment of the invention.

Referring to FIG. 4, a semiconductor memory device 1000 comprises a memory cell array 400, a row selection circuit 500, and a refresh control circuit 900. Semiconductor memory device 1000 further comprises an address counter 700 and a selection circuit 600. The plurality of bit lines and sense amplifiers as well as column selection circuitry conventionally associated with memory cell array 400 is omitted from FIG. 4 for clarity. However, those of ordinary skill in the art will recognize that memory cell array 400 includes a plurality of memory cells coupled to word lines and bit lines. As is conventional, the memory cells in memory cell array 400 requires periodic refresh. In one embodiment, the memory cells of memory cell array 400 are DRAM cells conventionally implemented with a single access transistor and a storage capacitor.

Refresh control circuit 900 generates an output voltage VOUT and a word line enable signal WEN in response to a self-refresh signal SREF, such that the output voltage VOUT is boosted during a refresh period and the word line enable signal WEN is activated following a delay associated with each refresh period. The word line enable signal delay may be determined in relation to the time required to sufficiently boost the output voltage VOUT. The self-refresh signal SREF may be provided by a command decoder (not shown), such as the type commonly used to decode commands received from an external system or device, such as a memory controller.

In the illustrated example of FIG. 4, refresh control circuit 900 comprises a refresh period controller 100, a voltage generator 200, and a word line enable circuit 300. This embodiment of refresh control circuit 900 will be described in some additional detail hereafter with reference to FIGS. 5 and 9.

However, returning to FIG. 4, row selection circuit 500 enables a selected word line from the plurality of word lines in accordance with a row address signal RADD, the output voltage VOUT and the word line enable signal WEN.

When semiconductor memory device 1000 is operating in self-refresh mode, the associated self-refresh operation may be performed periodically without repeated external commands. To accomplish this, semiconductor memory device 1000 utilizes address counter 700 and selection circuit 600. Address counter 700 generates an internal row address signal IRADD that may be changed during the refresh period. Selection circuit 600 selects between the internal row address signal IRADD and an external row address signal XRADD in response to the self-refresh signal SREF, and outputs the selection as row address signal RADD to row selection circuit 500. In one embodiment, selection circuit 600 may be implemented using a multiplexer that selects the internal row address signal IRADD when the self-refresh signal SREF is activated, or selects the external row address XRADD when the self-refresh signal SREF is deactivated.

Figure 5:
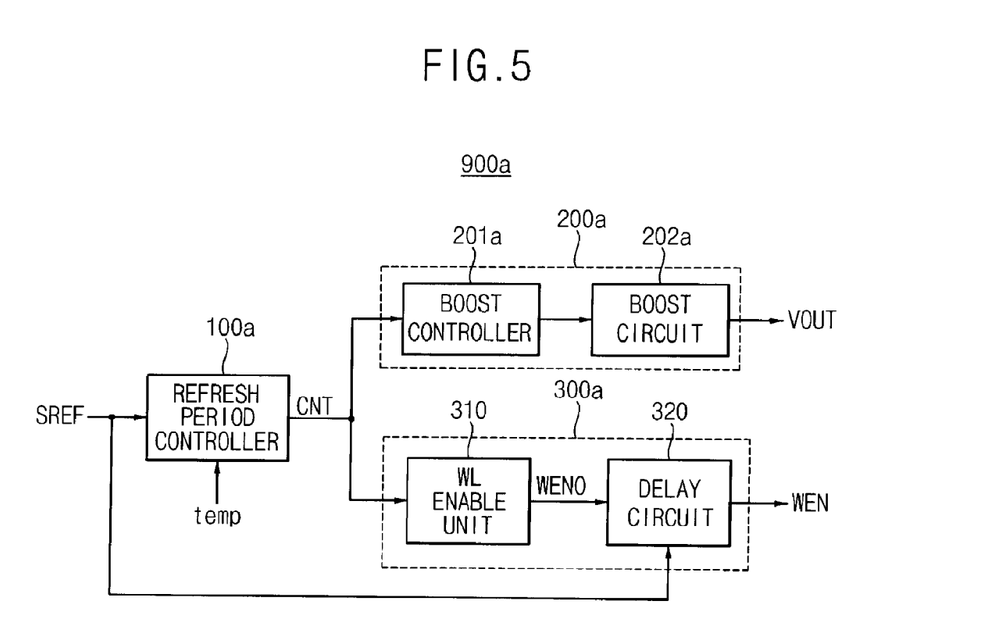
FIG. 5 is a refresh control circuit according to an embodiment of the invention.

FIG. 5 illustrates one possible embodiment of a refresh control circuit 900a that may be used within the context of the semiconductor memory device 1000 shown in FIG. 4.

Referring to FIG. 5, refresh control circuit 900a comprises a refresh period controller 100a, a voltage generator 200a, and a word line enable circuit 300a.

Figure 6:
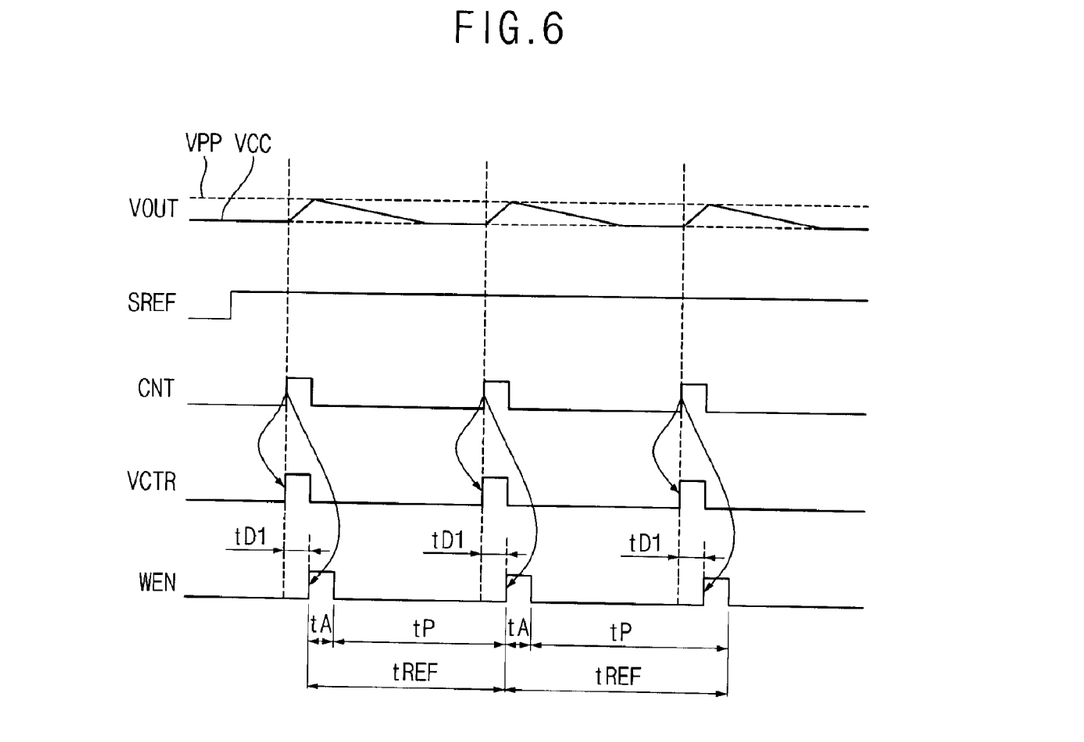
FIG. 6 is a related timing diagram further illustrating the refresh operation of the refresh control circuit of FIG. 5.

Refresh period controller 100a generates a control signal CNT in response to a self refresh signal SREF. As illustrated in FIG. 6, the control signal CNT indicates the nominal initiation of a refresh period tREF. The duration and rate of occurrence for the refresh period tREF may be determined in relation to various system parameters and/or operating conditions for the semiconductor memory device, as will be understood by those skilled in the art.

For example, refresh period controller 100a may be implemented using a pulse generator and a counter counting clock cycles and generating (activating) the control signal CNT on the basis of a predetermined number of counted clock cycles in order to define the duration of the refresh period tREF. The predetermined number of clock cycles may be provided as part of a mode register set (MRS) signal, for example, using conventional techniques. Alternatively, a frequency control circuit such as a phase-locked loop or a delay-locked loop may be used to generate a clock signal having a frequency defined in relation to the current operating conditions of the semiconductor memory device. In such a case, the control signal CNT may be provided by dividing the clock signal to determine the refresh period tREF. Typically, the leakage current associated with the memory cells of memory cell array 400 increases with operating temperature. Thus, refresh period controller 100a may further comprise (or be associated with) a temperature detector providing data indicative of the current operating temperature "temp". In this manner, the output of the frequency control circuit may be adjusted for temperature, which in turn adjusts the timing and/or duration of the refresh period.

Voltage generator 200a generates an output voltage VOUT in response to the control signal CNT such that the output voltage VOUT is boosted during each refresh period tREF. Voltage generator 200a may be configured to receive a power supply voltage VCC and generate the output voltage VOUT using conventional techniques. Further, as is conventionally understood, voltage generator 200a is configured to periodically pump up the power supply voltage VCC to a high voltage VPP.

The output voltage VOUT will nominally be maintained at the lower VCC level during a standby mode or similar powerdown mode of operation. Various configurations and related operating principals for voltage generator 200a are well known to those skilled in the art. However, in one embodiment of the invention, voltage generator 200a comprises a boost circuit 202a including one or more pumping capacitor(s), and a boost controller 201a controlling operation of boost circuit 202a. In this case, boost controller 201a generates a pumping signal in response to the control signal CNT, such that the pumping signal is activated during the refresh period. Boost circuit 202a may be used to boost the output voltage VOUT in response to the pumping signal.

Word line enable circuit 300a generates a word line enable signal WEN in response to the control signal CNT. The word line enable signal WEN is activated following a delay tD1 after the actuation of the control signal CNT (i.e., after an indication of the nominal initiation of the refresh period tREF). That is, the refresh period tREF is actually initiated after the indication of the nominal initiation of the refresh period tREF by the control signal CNT. The word line enable signal delay tD1 may be determined in relation to an amount of time necessary to sufficiently boost the output voltage VOUT. This delay will vary with the configuration of the voltage generator 200a and the overall performance characteristics of semiconductor memory device 1000.

In the embodiment illustrated in FIG. 5, word line enable circuit 300a comprises a word line enable unit 310 and a delay circuit 320. Word line enable unit 310 generates an initial word line enable signal WEN0 in response to the control signal CNT, such that the initial word line enable signal WEN0 is activated in synchronization with the boosting operation applied to the output voltage VOUT. In response to the self-refresh signal SREF, delay circuit 320 generates the word line enable signal WEN by delaying the initial word line enable signal WEN0 by a defined delay period.

The collective operation of these two circuits forming the word line enable circuit 300a of the illustrated example, determines the refresh period tREF and a timed occurrence of the word line enable signal WEN as a function of an WEN active period tA and a precharge period tP.

The operation of refresh control circuit 900a of FIG. 5 will now be further described with reference to the related timing diagram of FIG. 6. Referring to FIG. 6, refresh controller 100a generates the control signal CNT which is activated (like the refresh period tREF) while the self-refresh signal SREF is activated. Voltage generator 200a internally generates a pumping signal (i.e., voltage control signal VCRT) in response to the control signal CNT, such that the output voltage VOUT is boosted during the refresh period tREF. Word line enable unit 310 generates the initial word line enable signal WEN0 that determines the duration of the WEN active period tA. Delay circuit 320 delays the initial word line enable signal WEN0 for the word line enable signal delay tD1 in order to determine the periodic initiation of the word line enable signal WEN.

As illustrated in FIG. 6, a single refresh period tREF includes a WEN active period tA and a precharge period tP. During the WEN active period tA, the word line enable signal WEN is activated and respective high and low word line voltages are applied to the selected and all non-selected word lines of memory cell array 400, respectively. During the precharge period tP, the bit lines of memory cell array 400 are precharged and the row address is altered (i.e., incremented) to perform a next refresh operation.

As already noted, the word line enable signal delay tD1 may be determined in relation to the time required to sufficiently boost the output voltage VOUT. This delay value may be determined, for example, by the use of a simulation modeling the performance characteristics of voltage generator 200a in relation to overall semiconductor device design.

As such, the word line enable signal WEN may be activated when the output voltage VOUT is fully boosted up from its low voltage level VCC to its high voltage level VPP. With this timing definition, the abnormal refresh operation that plagues the conventional semiconductor memory device may be avoided (i.e., the insufficient application of voltage to the word line can be prevented) and at the same time excessive power consumption may be avoided.

Figure 7:
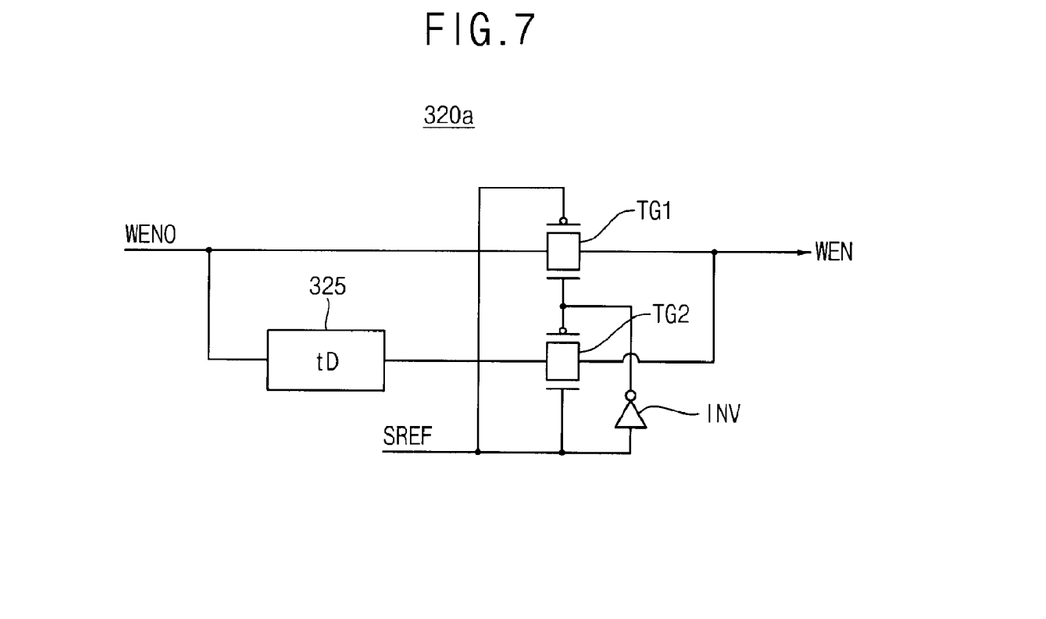
FIG. 7 is a circuit diagram further illustrating the delay circuit in the refresh control circuit of FIG. 5.

FIG. 7 is a circuit diagram further illustrating one example of a delay circuit 320a that may be used within the context of the refresh control circuit illustrated in FIG. 5.

Delay circuit 320a may be used to determine whether the initial word line enable signal WEN0 is delayed or not according the operating mode of the semiconductor memory device. Thus, delay circuit 320a may be configured to generate the word line enable signal WEN by delaying the initial word line enable signal WEN0 for the defined delay period tD1 while the self-refresh signal SREF is activated (i.e. during a self-refresh mode), but by merely outputting without delay the initial word line enable signal WEN0 as the word line enable signal WEN while the self-refresh signal SREF is deactivated (i.e. during a write mode or a read mode).

Referring to FIG. 7, delay circuit 320a comprises a first transfer gate TG1, a delay unit 325, and a second transfer gate TG2.

Delay unit 325 delays the initial word line enable signal WEN0 by the delay period tA1 in order to generate a delayed version of the word line enable signal WEN. First transfer gate TG1 operates in response to complementary versions the self-refresh signal SREF and is turned ON while the self-refresh signal SREF is deactivated. As such, first transfer gate TG1 passes the initial word line enable signal WEN0 as the word line enable signal WEN without delay during "normal" operating modes, such as read/write modes. Second transfer gate TG2 is turned ON and passes the delay version of the word line enable signal from delay unit 325 while the self-refresh signal SREF is activated.

In certain embodiments of the invention, transfer gates TG1 and TG2 may be replaced with arbitrary switching elements that operate in response to the self-refresh signal SREF, and delay unit may be implemented with an inverter chain.

Figure 8:
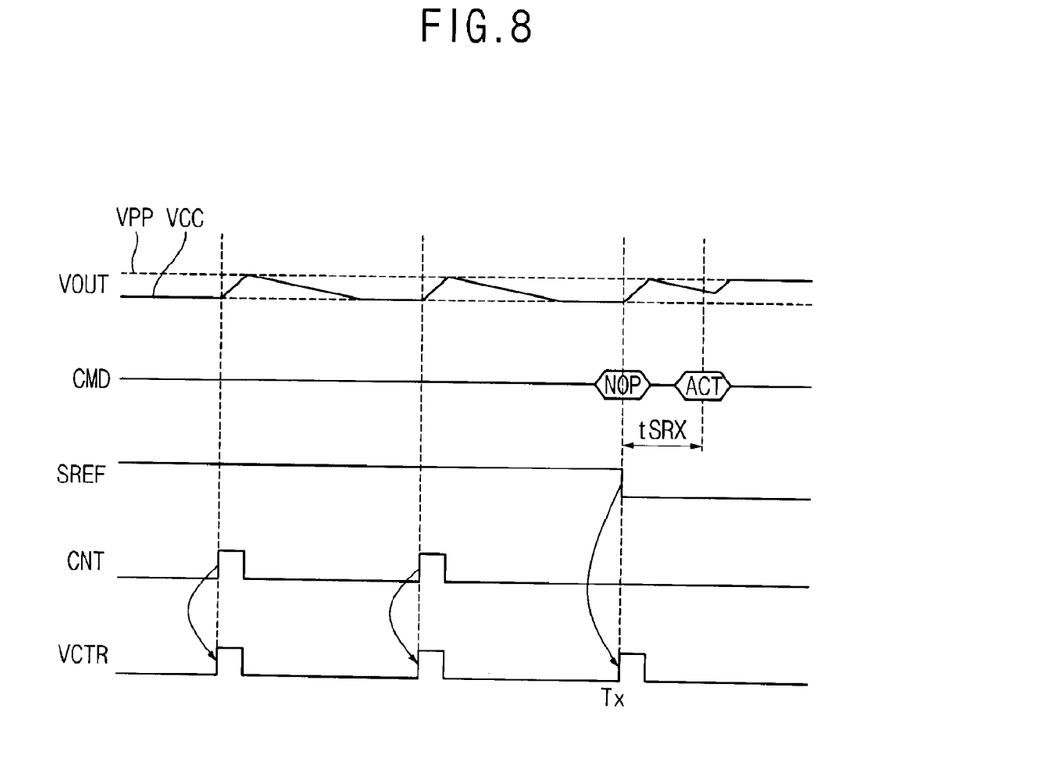
FIG. 8 is a related timing diagram further illustrating the operation of the refresh control circuit of FIG. 5 when a self-refresh mode is terminated.

FIG. 8 is a timing diagram illustrating the operation of the refresh control circuit of FIG. 5 when a self-refresh mode is terminated. Referring to FIGS. 5 and 8, voltage generator 200a is configured to further boost the output voltage VOUT at a termination point Tx upon deactivation of the self-refresh signal indicating the end of the self-refresh mode of operation.

The self-refresh mode of operation may be terminated for many reasons including receipt of an external commands CMD. When the self-refresh mode is terminated, voltage generator 200a maintains the output voltage VOUT at a level approximately equal to the high voltage VPP. Assuming a time duration tSRX between termination of the self-refresh mode and a next command ACT, it is possible that an abnormal operation may occur if the output voltage VOUT drifts to an insufficient level. In order to prevent this occurrence, the boost controller in voltage generator 200a may further activate the pumping signal VCRT at the termination point Tx in response to the deactivation of the self-refresh signal SREF.

Figure 9:
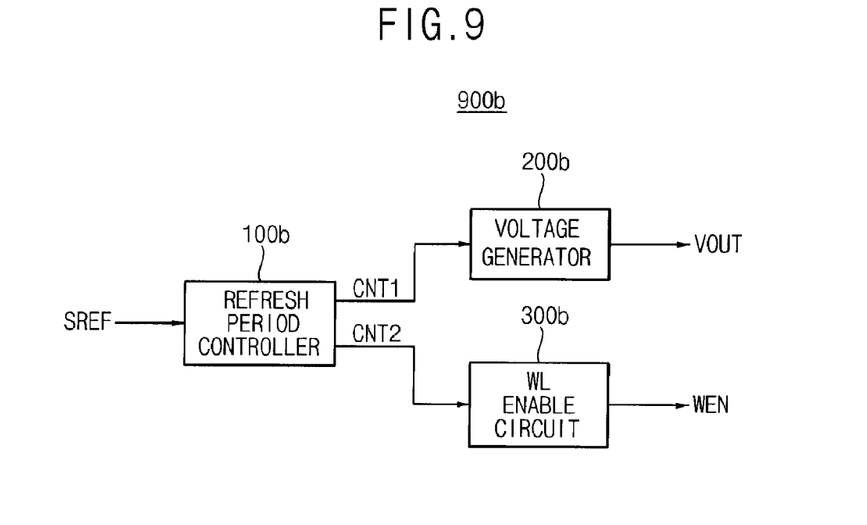
FIG. 9 is a refresh control circuit according to another embodiment of the invention.

FIG. 9 illustrates a refresh control circuit according to another example embodiment of the invention.

Referring to FIG. 9, refresh control circuit 900b includes refresh period controller 100b, voltage generator 200b, and word line enable circuit 300b. Thus, voltage generator 200b is largely similar to the voltage generator 200a of FIG. 5.

However, in contrast to the embodiment of FIG. 5, refresh period controller 100b of FIG. 8 generates two control signals including a first count signal CNT1 having a first delay period tD1 and a second count signal CNT2 having a second delay period tD2 offset from (or sequentially applied in time) with respect to the first delay period tD1. Further, word line enable circuit 300b omits delay circuit 320 as illustrated in FIG. 5.

Hereinafter, the operation of refresh control circuit 900b illustrated in FIG. 9 will be described with reference to the related timing diagram of FIG. 10.

Figure 10:
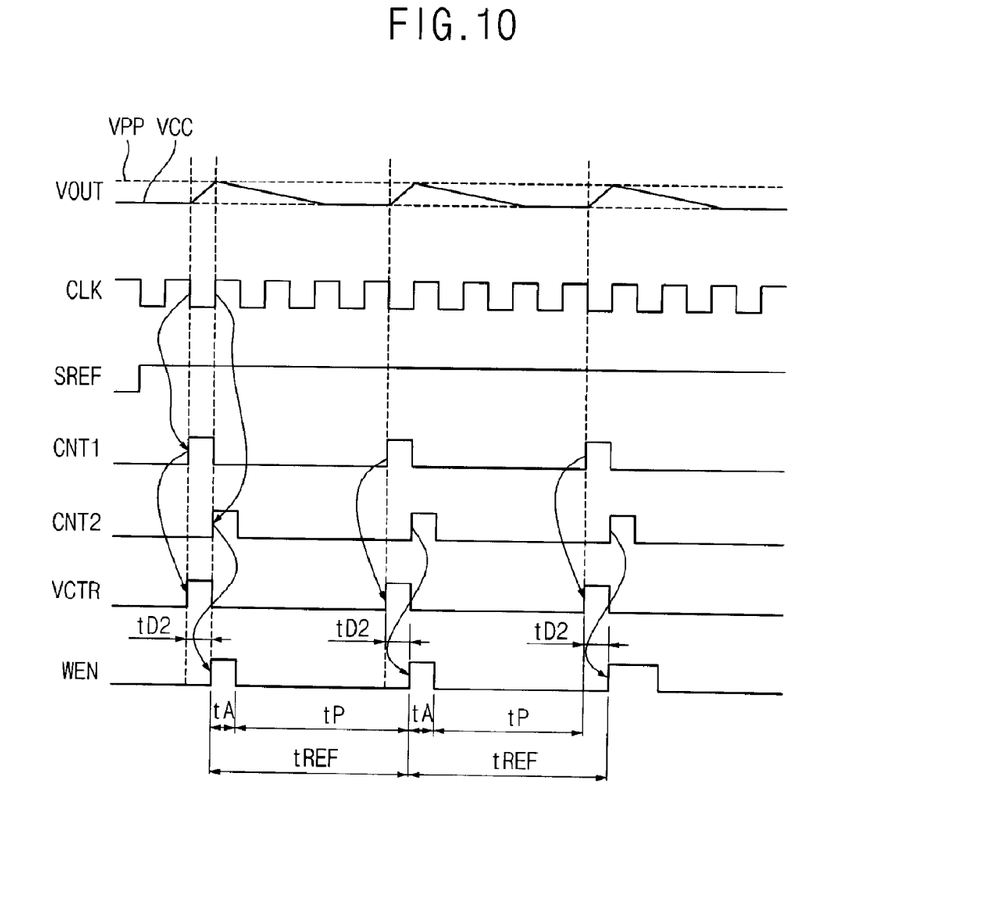
FIG. 10 is a related timing diagram further illustrating the refresh operation of the refresh control circuit of FIG. 9.

Referring to FIG. 10, the first count signal CNT1 and the second count signal CNT2 are generated by counting a predetermined number of clock cycles for a reference clock signal CLK. The predetermined number of clock cycles corresponds to the refresh period tREF, and the second count signal CNT2 is delayed by the second delay period tD2 with respect to the first count signal CNT1. Voltage generator 200b is configured to boost the output voltage VOUT in response to the first count signal CNT1 so that the output voltage VOUT may be boosted during the refresh period tREF, and word line enable circuit 300b is configured to activate the word line enable signal WEN in response to the second count signal CNT2 so that the word line enable signal WEN is activated following the second delay period tD2 during the refresh period tREF. The second delay period tD2 may correspond to half the period of the reference clock signal and may be altered in accordance with the current operating conditions of the semiconductor memory devices. As such, the word line enable signal WEN may be activated when the output voltage VOUT is fully boosted from the low voltage VCC to the high voltage VPP.

The respective elements in the refresh control circuit according to the foregoing embodiments of the invention may perform other functions in addition to those described in relation to the refresh operation, and may be variously disposed in respective functional circuit blocks within the overall architecture of the semiconductor memory device.

Even though the present invention has been described in the context of a DRAM including DRAM memory cells requiring periodic refresh, it will be understood that the teachings of the invention may be applied to any type of semiconductor device comprising data storage circuits benefiting from periodic refresh during a standby mode or similar power-down mode of operation.

Embodiments of the invention provide a semiconductor device having overall power consumption reduced by improved control over the timings of a word line enable signal and a voltage applied to word lines during a self-refresh mode of operation. Further, abnormal operations caused by insufficiently boosted word line voltages may be prevented, thereby improving performance of the semiconductor memory device.

While the example embodiments of the invention have been described in detail, it should be understood that various changes, substitutions and alterations may be made herein without departing from the scope of the invention.

What is claimed is:

1. A refresh control circuit in a semiconductor memory device, comprising:
    a refresh period controller configured to generate a control signal in response to a self-refresh signal, wherein the control signal indicates a nominal initiation of a refresh period;
    a voltage generator configured to generate an output voltage in response to the control signal, wherein the output voltage is boosted from a low voltage to a high voltage during the refresh period; and a word line enable circuit configured to generate a word line enable signal in response to the control signal, wherein the word line enable signal is activated following a delay after the nominal initiation of the refresh period, and the delay allows the voltage generator to fully boost the output voltage.

2. The refresh control circuit of claim 1, wherein the word line enable circuit comprises:

a word line enable unit configured to generate an initial word line enable signal in response to the control signal, wherein the initial word line enable signal is activated in synchronization with the boosting the output voltage by the voltage generator; and a delay circuit operating in response to the self-refresh signal and configured to generate the word line enable signal by delaying the initial word line enable signal.

3. The refresh control circuit of claim 2, wherein the delay circuit is configured to alternately generate the word line enable signal by delaying the initial word line enable signal while the self-refresh signal is activated, or pass the initial word line enable signal without delay as the word line enable signal while the self-refresh signal is deactivated.

4. The refresh control circuit of claim 2, wherein the delay circuit comprises:

a first transfer gate configured to pass the initial word line enable signal while the self-refresh signal is deactivated;

a delay unit configured to delay the initial word line enable signal to generate the word line enable signal; and a second transfer gate configured to pass the word line enable signal received from the delay unit while the self-refresh signal is activated.

5. The refresh control circuit of claim 1, wherein the refresh period controller comprises:

a counter configured to generate the control signal by counting a predetermined number of cycles of a reference clock signal corresponding to the refresh period.

6. The refresh control circuit of claim 5, wherein the control signal includes a first count signal having a first delay period and a second count signal having a second delay period, wherein actuation of the second count signal is delayed relative to the actuation of the first count signal.

7. The refresh control circuit of claim 6, wherein the second delay period corresponds to half the period of the reference clock signal.

8. The refresh control circuit of claim 6, wherein the voltage generator is configured to boost the output voltage in response to the first count signal, and the word line enable circuit is configured to activate the word line enable signal in response to the second count signal.

9. The refresh control circuit of claim 5, wherein the refresh period controller is responsive to a temperature signal generated by a temperature sensor detecting a current operating temperature for the semiconductor memory device; and the refresh period controller further comprises; a frequency control circuit configured to adjust the frequency of the reference clock signal in accordance with the temperature signal.

10. The refresh control circuit of claim 1, wherein the voltage generator comprises:

a boost controller configured to generate a pumping signal in response to the control signal, wherein the pumping signal is activated during the refresh period; and a boost circuit configured to boost the output voltage from the low voltage to the high voltage in response to the pumping signal.

11. The refresh control circuit of claim 10, wherein the boost controller is further configured to activate the pumping signal when the self-refresh signal is deactivated.

12. A semiconductor memory device, comprising:

a memory cell array including a plurality of memory cells coupled to word lines and bit lines, respectively;

a refresh control circuit configured to generate an output voltage and a word line enable signal in response to a self-refresh signal indicating a nominal initiation of a refresh period, wherein the output voltage is boosted during the refresh period, the word line enable signal is activated following a delay after the nominal initiation of the refresh period, and the delay allows the voltage generator to fully boost the output voltage; and a row selection circuit configured to enable a selected word line in relation to a row address signal, the output voltage, and the word line enable signal.

13. The semiconductor memory device of claim 12, wherein the refresh control circuit comprises:

a refresh period controller configured to generate a control signal in response to the self-refresh signal;

a voltage generator configured to generate the output voltage in response to the control signal, wherein the output voltage is boosted from a low voltage to a high voltage during the refresh period; and a word line enable circuit configured to generate the word line enable signal in response to the control signal.

14. The semiconductor memory device of claim 13, wherein the word line enable circuit comprises:

a word line enable unit configured to generate an initial word line enable signal in response to the control signal, wherein the initial word line enable signal is activated in synchronization with boosting the output voltage by the voltage generator; and a delay circuit operating in response to the self-refresh signal and configured to generate the word line enable signal by delaying the initial word line enable signal.

15. The semiconductor memory device of claim 14, wherein the delay circuit is configured to alternately generate the word line enable signal by delaying the initial word line enable signal while the self-refresh signal is activated, or pass the initial word line enable signal without delay as the word line enable signal while the self-refresh signal is deactivated.

16. The semiconductor memory device of claim 13, wherein the refresh period controller comprises:

a counter configured to generate the control signal by counting a predetermined number of cycles of a reference clock signal corresponding to the refresh period.

17. The semiconductor memory device of claim 16, wherein the refresh period controller is responsive to a temperature signal generated by a temperature sensor detecting a current operating temperature for the semiconductor memory device.

18. The semiconductor memory device of claim 12, further comprising:

an address counter configured to generate an internal row address that is changed per the refresh period; and a selection circuit configured to select one of the internal row address and an external row address in response to the self-refresh signal, and output either the internal row address or the external row address as a selected row address signal to the row selection circuit.

* * * * *